United States Patent
Yoo et al.

(10) Patent No.: US 10,087,348 B2
(45) Date of Patent: Oct. 2, 2018

(54) PELLICLE INCLUDING A WATER-SOLUBLE ADHESIVE AND PHOTOMASK ASSEMBLY INCLUDING THE PELLICLE

(71) Applicants: Samsung Electronics Co., Ltd., Suwon-si, Gyeonggi-do (KR); FINE SEMITECH CORP., Gyeonggi-do, Hwaseong-si (KR)

(72) Inventors: Byungchul Yoo, Yongin-si (KR); Sungyong Cho, Suwon-si (KR); Jaehyuck Choi, Seoul (KR); Jeongsu Yang, Bucheon-si (KR); Donghoon Chung, Yongin-si (KR); Han-Shin Lee, Hwaseong-si (KR); Myungjun Kim, Osan-si (KR); Ikjun Kim, Osan-si (KR); Jikang Kim, Osan-si (KR); Jeonghwan Min, Osan-si (KR); Kyoungchae Seo, Osan-si (KR)

(73) Assignees: Samsung Electronics Co., Ltd. (KR); Fine Semitech Corp. (KR)

( * ) Notice: Subject to any disclaimer, the term of this patent is extended or adjusted under 35 U.S.C. 154(b) by 0 days.

(21) Appl. No.: 15/254,701

(22) Filed: Sep. 1, 2016

(65) Prior Publication Data

US 2017/0088755 A1 Mar. 30, 2017

(30) Foreign Application Priority Data

Sep. 30, 2015 (KR) .................. 10-2015-0137931

(51) Int. Cl.
*C08F 8/44* (2006.01)
*C08F 220/06* (2006.01)
(Continued)

(52) U.S. Cl.
CPC ......... *C09J 133/10* (2013.01); *C09J 133/068* (2013.01); *C09J 133/08* (2013.01);
(Continued)

(58) Field of Classification Search
None
See application file for complete search history.

(56) References Cited

U.S. PATENT DOCUMENTS 3,050,425 A * 8/1962 Carr, Jr. .................. B32B 27/00
156/332
5,643,654 A 7/1997 Fujita et al.
(Continued)

FOREIGN PATENT DOCUMENTS

KR 10-0647866 11/2006

*Primary Examiner* — Richard A Huhn
(74) *Attorney, Agent, or Firm* — Myers Bigel, P.A.

(57) ABSTRACT

A pellicle including a water-soluble adhesive and a photomask assembly including the pellicle are provided. A pellicle may include a membrane, a pellicle frame, and a water-soluble adhesive disposed on the pellicle frame. The water-soluble adhesive may be prepared by a mixture including a water-soluble acrylic adhesive material in an amount of about 40% to about 55% by weight of the mixture, water or a solution of water and alcohol in an amount of about 40% to about 55% by weight of the mixture, and an additive in an amount of about 1% to about 5% by weight of the mixture.

18 Claims, 14 Drawing Sheets

(51) Int. Cl.
  *C09J 133/10*  (2006.01)
  *G03F 1/64*  (2012.01)
  *G03F 1/82*  (2012.01)
  *C09J 133/08*  (2006.01)
  *C09J 133/06*  (2006.01)
  *C08F 6/02*  (2006.01)
  *C09J 133/02*  (2006.01)

(52) U.S. Cl.
  CPC ................ *G03F 1/64* (2013.01); *G03F 1/82* (2013.01); *C08F 6/02* (2013.01); *C08F 8/44* (2013.01); *C08F 220/06* (2013.01); *C09J 133/02* (2013.01)

(56) References Cited

U.S. PATENT DOCUMENTS

| | | |
|---|---|---|
| 8,002,899 B2 | 8/2011 | Wu et al. |
| 8,404,405 B2 | 3/2013 | Kim et al. |
| 8,507,158 B2 | 8/2013 | Murakami et al. |
| 8,652,711 B2 | 2/2014 | Shirasaki |
| 2006/0257754 A1 | 11/2006 | Harubayashi et al. |
| 2015/0037574 A1 | 2/2015 | Amano et al. |

\* cited by examiner

PELLICLE INCLUDING A WATER-SOLUBLE ADHESIVE AND PHOTOMASK ASSEMBLY INCLUDING THE PELLICLE

CROSS-REFERENCE TO RELATED APPLICATION

This application claims priority under 35 U.S.C. § 119 to Korean Patent Application No. 10-2015-0137931 filed on Sep. 30, 2015, the disclosure of which is hereby incorporated by reference in its entirety.

BACKGROUND

The inventive concept relates to a water-soluble adhesive, a method of forming the water-soluble adhesive, a pellicle including the water-soluble adhesive, a photomask assembly including the pellicle, a method of attaching the pellicle to the photomask, and a method of detaching the pellicle from the photomask and cleaning the pellicle.

A pellicle may be attached to a photomask to protect optical pattern regions of the photomask. A pellicle may include optically transparent membranes. Since a pellicle is consumable, after a pellicle has been used in a photolithography process for a predetermined time, the pellicle may be replaced with a new one. In order to replace the pellicle, the used pellicle may be physically detached from the photomask. After the pellicle is detached, pellicle adhesive residue may remain on the photomask. When an acid or hydrogen peroxide is used to remove the pellicle adhesive residue, the photomask may be damaged and haze defects may occur on the photomask.

SUMMARY

A pellicle may include a pellicle frame, a membrane disposed on an upper surface of the pellicle frame and a pellicle adhesive disposed on a lower surface of the pellicle frame. The pellicle adhesive may include a water-soluble acrylic adhesive material.

In various embodiments, the water-soluble acrylic adhesive material may include at least one of a copolymer of an acrylate monomer and an acrylic acid monomer and a copolymer of an acrylate monomer and an amide monomer.

According to various embodiments, the acrylic acid monomer may include at least one of a COOK group, a COONa group, a COOCa group, and a COONHR$_3$ group. R may be hydrogen or a C$_1$ to C$_3$ alkyl group. The amide monomer may include at least one of a CONHK group, a CONHNa group and a CONHCa group.

According to various embodiments, the COOK group, the COONa group, the COOCa group, and the COONHR$_3$ group of the acrylic acid monomer may be formed by substituting a hydrogen ion in a COOH group of the acrylic acid monomer with a potassium ion (K$^+$), a sodium ion (Na$^+$), a calcium ion (Ca$^+$) or an ammonium ion (NHR$_3{}^+$). The CONHK group, the CONHNa group, and the CONHCa group of the amide monomer may be formed by substituting a hydrogen ion in a CONH$_2$ group of the amide monomer with a potassium ion (K$^+$), a sodium ion (Na$^+$) or a calcium ion (Ca$^+$).

In various embodiments, the acrylate monomer may include at least one of methyl acrylate, ethyl acrylate, isopropyl acrylate, n-butyl acrylate, 2-ethylhexyl acrylate, n-butyl methacrylate, and glycidyl methacrylate.

According to various embodiments, the acrylic acid monomer may include at least one of acrylic acid and methacrylic acid.

In various embodiments, the amide monomer may include at least one of acrylamide, methacrylamide and maleimide.

In various embodiments, the pellicle may further include a membrane adhesive disposed between the pellicle frame and the membrane and a liner disposed on the pellicle adhesive.

A method of manufacturing a pellicle adhesive may include copolymerizing an acrylate monomer and a functional monomer. The functional monomer may include a COOH group or a CONH$_2$ group. The method may also include substituting a hydrogen ion of the COOH group or the CONH$_2$ group with a sodium ion (Na$^+$), a potassium ion (K$^+$), a calcium ion (Ca$^+$), or an ammonium ion (NHR$_3{}^+$) to form a water-soluble acrylic adhesive material. R may be hydrogen or a C$_1$ to C$_3$ alkyl group. In some embodiments, the water-soluble acrylic adhesive material may be used to manufacture the pellicle adhesive.

According to various embodiments, the copolymerizing may be initiated by a radical initiator, and the radical initiator may include at least one of azobis iso-butyro nitrile, benzoyl peroxide, di-tert-butyl peroxide, and tert-butyl peroxybenzoate.

In various embodiments, the substituting may be performed using at least one salt of KOH, NaOH, Ca(OH)$_2$, and NH$_4$OH.

According to various embodiments, the acrylate monomer may include at least one of methyl acrylate, ethyl acrylate, isopropyl acrylate, n-butyl acrylate, 2-ethylhexyl acrylate, n-butyl methacrylate, and glycidyl methacrylate.

According to various embodiments, the functional monomer may include an acrylic acid monomer or an amide monomer.

In various embodiments, the acrylic acid monomer may include at least one of acrylic acid and methacrylic acid.

According to various embodiments, the amide monomer may include at least one of acrylamide, methacrylamide, and maleimide.

In various embodiments, the copolymerizing may be performed at a temperature in a range of about 30° C. to about 150° C., and the substituting may be performed at a temperature in a range of about 0° C. to about 100° C.

In various embodiments, the copolymerizing and substituting may include mixing a solvent in an amount of about 25% to about 66% by weight of the water-soluble acrylic adhesive material, the acrylate monomer in an amount of about 20% to about 55% by weight of the water-soluble acrylic adhesive material, and the functional monomer in an amount of about 10% to about 30% by weight of the water-soluble acrylic adhesive material.

According to various embodiments, the method may further include preparing a mixture including the water-soluble acrylic adhesive material in an amount of about 40% to about 55% by weight of the pellicle adhesive, water or a solution of water and alcohol in an amount of about 40% to about 55% by weight of the pellicle adhesive, and an additive in an amount of about 1% to about 5% by weight of the pellicle adhesive and heating the mixture.

In various embodiments, the alcohol may include at least one of methanol, ethanol, butanol, and isopropanol.

In various embodiments, the additive may include a stabilizer and/or a dispersant.

A method of cleaning a photomask may include detaching a pellicle from a surface of the photomask and performing a cleaning process using water to remove an acrylic pellicle adhesive residue remaining on the surface of the photomask.

According to various embodiments, the cleaning process may not use sulfuric acid or hydrogen peroxide.

In various embodiments, the acrylic pellicle adhesive residue may include a copolymer of an acrylate monomer and a functional monomer, and the functional monomer may include at least one of a COONa group, a COOK group, a COOCa group, and a COONHR$_3$ group. R may be hydrogen or a C$_1$ to C$_3$ alkyl group.

According to various embodiments, the cleaning process may include at least one of a spin spraying process, a scrubbing process, a dipping process, and a mega-sonic process.

According to various embodiments, the method may further include drying the photomask using one of a drying process using isopropyl alcohol (IPA) and a heating process.

A method of manufacturing an adhesive may include preparing a mixture including an acrylic adhesive material in an amount of about 40% to about 55% by weight of the adhesive and water or a solution of water and alcohol in an amount of about 40% to about 55% by weight of the adhesive and heating the mixture.

According to various embodiments, the acrylic adhesive material may include a copolymer of an acrylate monomer and an acrylic acid monomer or a copolymer of an acrylate monomer and an amide monomer. The acrylic acid monomer may include a COOM group or a COONHR$_3$ group, and M may be a metal ion and R may be hydrogen or a C$_1$ to C$_3$ alkyl group. The amide monomer may include a CONHM group, and M may be a metal ion.

In various embodiments, the metal ion may include a sodium ion (Na$^+$), a potassium ion (K$^+$) or a calcium ion (Ca$^+$).

In various embodiments, the acrylate monomer may include methyl acrylate, ethyl acrylate, isopropyl acrylate, n-butyl acrylate, 2-ethylhexyl acrylate, n-butyl methacrylate or glycidyl methacrylate.

According to various embodiments, the acrylic acid monomer may include acrylic acid or methacrylic acid.

According to various embodiments, the amide monomer may include acrylamide, methacrylamide, or maleimide.

In various embodiments, the alcohol may include methanol, ethanol, butanol, or isopropanol.

According to various embodiments, the mixture may include an additive in an amount of about 1% to about 5% by weight of the adhesive.

A composition may include an acrylate monomer and an acrylic acid monomer or an amide monomer. The acrylic acid monomer may include at least one of a COOK group, a COONa group, a COOCa group, and a COONHR$_3$ group. R may be hydrogen or a C$_1$ to C$_3$ alkyl group.

The amide monomer may include at least one of a CONHK group, a CONHNa group and a CONHCa group.

According to various embodiments, a copolymer may be prepared from the acrylate monomer and the acrylic acid monomer or a copolymer may be prepared from the acrylate monomer and the amide monomer.

According to various embodiments, the acrylate monomer may be present in an amount of about 20% to about 55% by weight of the composition, and the acrylic acid monomer or the amide monomer may be present in an amount of about 5% to about 20% by weight of the composition.

In various embodiments, the composition may further include a solvent present in an amount of about 25% to about 75% by weight of the composition.

BRIEF DESCRIPTION OF THE DRAWINGS

The foregoing as well as other features and advantages of the inventive concept will be apparent from the description of example embodiments of the inventive concept illustrated in the accompanying drawings. Like reference numerals refer to like elements throughout. The drawings are not necessarily to scale, the sizes and relative sizes of layers and regions may be exaggerated for clarity. In the drawings.

DETAILED DESCRIPTION OF THE EMBODIMENTS

Figure 1A:
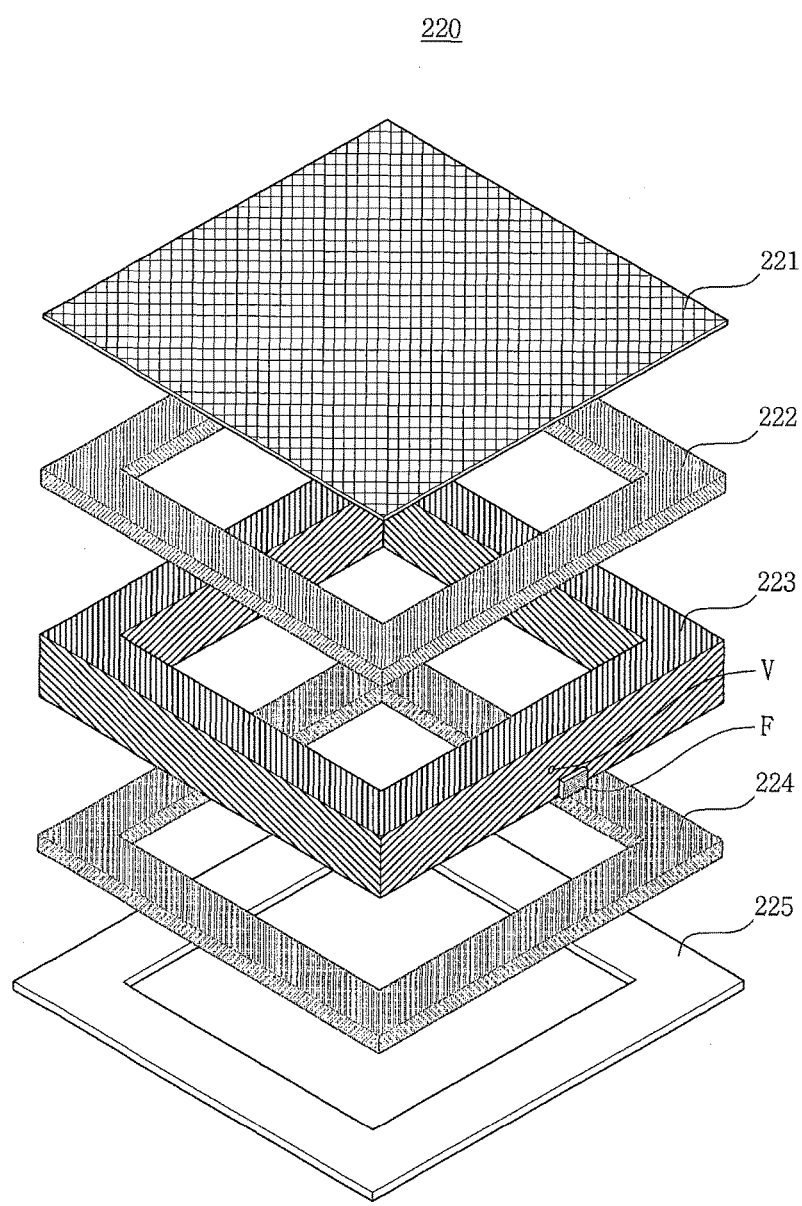
FIGS. 1A and 1B are a exploded perspective view and a cross-sectional view of a pellicle according to some embodiments of the inventive concept, respectively.

The inventive concept will now be described more fully with reference to the accompanying drawings to clarify aspects, features, and advantages of the inventive concept. The inventive concept may, however, be embodied in many different forms and should not be construed as being limited to the embodiments set forth herein. Rather, these embodiments are provided so that this disclosure will be through and complete and will fully convey the inventive concept to those of ordinary skill in the art.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, steps, operations, elements, and/or components, but do not preclude the presence or addition of one or more other features, steps, operations, elements, components, and/or groups thereof.

Spatially relative terms, such as "beneath," "below," "lower," "above," "upper," and the like, may be used herein, for ease of description, to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features.

Like reference numerals refer to like elements throughout. Thus, the same or similar reference numerals may be described with reference to other figures even if those reference numerals are neither mentioned nor described in the corresponding figures. Further, elements that are not denoted by reference numerals may be described with reference to other figures. As used herein the term "and/or" includes any and all combinations of one or more of the associated listed items.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the inventive concept.

Figure 1B:
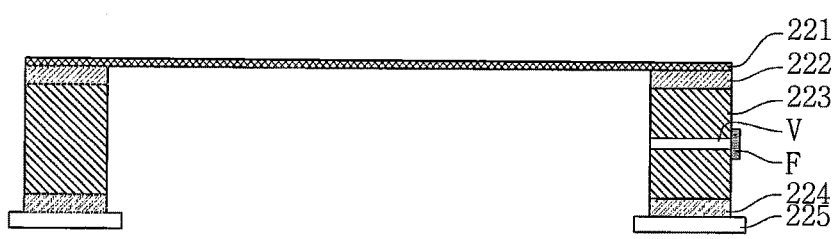

FIG. 1A is an exploded perspective view of a pellicle 220 according to some embodiments of the inventive concept, and FIG. 1B is a cross-sectional view of the pellicle 220.

Referring to FIGS. 1A and 1B, the pellicle 220 according to some embodiments of the inventive concept may include a pellicle frame 223, a membrane 221, and a pellicle adhesive 224.

The pellicle frame 223 may include one of aluminum (Al), an acrylic polymer, and polycarbonate. At least one side of the pellicle frame 223 may include a vent hole V. The pellicle frame 223 may further include a filter F covering the vent hole V on the side of the pellicle frame 223.

The membrane 221 may include one of zirconium, silicon, molybdenum, molybdenum disilicide, yttrium, rubidium, strontium, niobium, ruthenium, graphene, graphite, and various cellulose films.

The pellicle adhesive 224 may include a water-soluble adhesive. For example, the water-soluble adhesive may be prepared by heating a mixture including a water-soluble acrylic adhesive material in an amount of about 40% to about 55% by weight of the mixture, water or a water and alcohol solution in an amount of about 40% to about 55% by weight of the mixture, and an additive in an amount of about 1% to about 5% by weight of the mixture. The water-soluble acrylic adhesive material may include a copolymer of an acrylate monomer and an acrylic acid monomer and/or a copolymer of an acrylate monomer and an acrylic amide monomer. The acrylic acid monomer or acrylic amide monomer may include a functional group in which an acidic hydrogen atom (e.g., hydrogen ion) is substituted with a sodium ion ($Na^+$), a potassium ion ($K^+$), a calcium ion ($Ca^+$), or an ammonium ion ($NHR_3^+$, wherein R is hydrogen or a $C_1$ to $C_3$ alkyl group). The alcohol may include methanol, ethanol, propanol, or butanol. The additive may include a stabilizer and/or a dispersant. The pellicle adhesive 224 may have a thickness of about 100 to about 150 micrometer (μm).

The pellicle 220 may further include a membrane adhesive 222 between the pellicle frame 223 and the membrane 221. The membrane adhesive 222 may be formed on an upper surface of the pellicle frame 223 and may attach the membrane 221 to the pellicle frame 223. The membrane adhesive 222 may include a polymer resin. In some embodiments, the membrane adhesive 222 may be omitted. For example, the membrane 221 may be directly attached to the pellicle frame 223.

The pellicle 220 may further include a liner 225 disposed on a lower surface of the pellicle adhesive 224. The liner 225 may protect the pellicle adhesive 224. The liner 225 may include a polymer plastic resin such as polyethylene terephthalate. The liner 225 may have a thickness of about 0.05 to about 0.2 μm. The liner 225 may be removed before the pellicle 220 is attached to a photomask.

Figure 2:
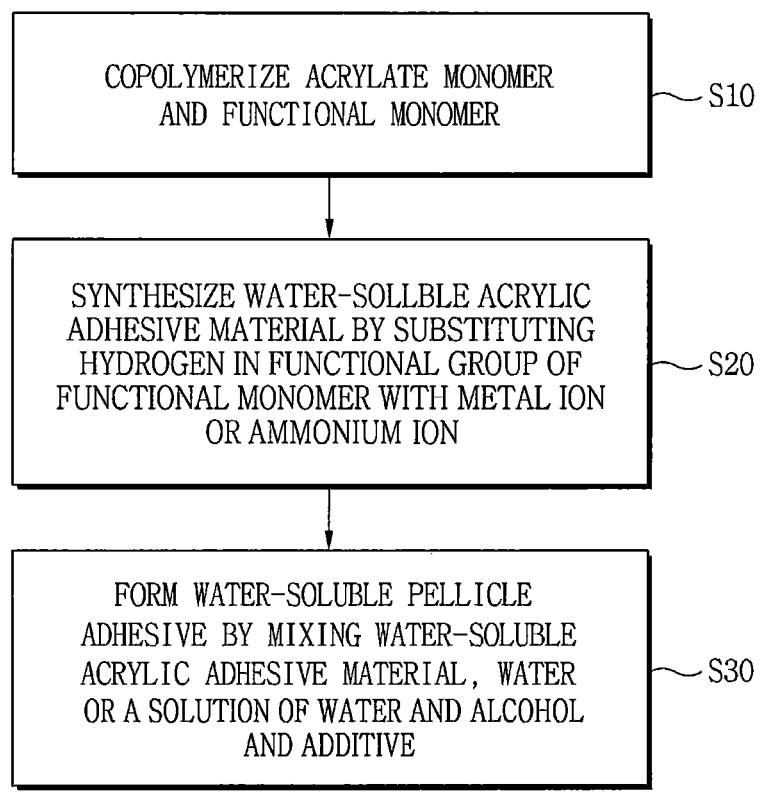
FIG. 2 is a flowchart of a method of manufacturing a pellicle adhesive according to some embodiments of the inventive concept.

FIG. 2 is a flowchart a method of manufacturing the pellicle adhesive 224 according to some embodiments of the inventive concept.

Referring to FIG. 2, the method of manufacturing the pellicle adhesive 224 according to some embodiments of the inventive concept may include copolymerizing an acrylate monomer and a functional monomer including a functional group (S10). The acrylate monomer may include at least one of methyl acrylate, ethyl acrylate, isopropyl acrylate, n-butyl acrylate, 2-thylhexyl acrylate, n-butyl methacrylate, and glycidyl methacrylate. The functional monomer may include a functional group such as, but not limited to, —COOH or —$NH_2$ and may include at least one of acrylic acid, methacrylic acid, acrylamide, methacrylamide, and maleimide. The functional group may include an acidic hydrogen in, for example, —COOH or —$NH_2$.

The copolymerization may be initiated using a radical initiator. The radical initiator may be one of azobis isobutyro nitrile, benzoyl peroxide, di-tert-butyl peroxide, and tert-butyl peroxybenzoate. The copolymerization may be performed at a temperature in the range of about 30° C. to about 150° C.

The method may include synthesizing a water-soluble acrylic adhesive material by substituting a hydrogen ion in the functional group of the functional monomer with a metal ion or an ammonium ion (S20). For example, the method may include substituting a hydrogen ion in —COOH or —$NH_2$ of the functional monomer with a sodium ion ($Na^+$), a potassium ion ($K^+$), a calcium ion ($Ca^+$), and an ammonium ion ($NHR_3^+$, wherein R is hydrogen or a $C_1$ to $C_3$ alkyl group). In some embodiments, an acidic hydrogen of the functional group may react with at least one of potassium hydroxide, sodium hydroxide, calcium hydroxide, and ammonium hydroxide and may be substituted with at least one of a potassium ion ($K^+$), a sodium ion ($Na^+$), a calcium ion ($Ca^+$), and an ammonium ion ($NHR_3^+$, wherein R is hydrogen or a $C_1$ to $C_3$ alkyl group). The copolymerization and the substitution of the acidic hydrogen may be performed in a solvent which include water, methanol, ethanol, propanol, hexane, diethyl ether, isopropyl alcohol, tetrahydrofuran, acetone, ethyl acetate, and/or methyl acetate. The metal ion may be provided by a metal salt (e.g., KOH, NaOH, or $Ca(OH)_2$) and the ammonium ion may be provided by an amine salt (e.g., $NH_4OH$). The substitution of the acidic hydrogen may be performed at a temperature in a range of about 0° C. to about 100° C. For example, the water-soluble acrylic adhesive material may be prepared using a mixture including the solvent in an amount of about 25% to about 75% by weight of the mixture, the acrylate monomer in an amount of about 20% to about 55% by weight of the mixture, the functional monomer in an amount of about 5% to about 20% by weight of the mixture, the radical initiator in an amount of about 0.1% to about 3% by weight of the mixture, and the metal salt or amine salt in an amount of about 3% to about 5% by weight of the mixture. In some embodiments, the copolymerization and the substitution of the acidic hydrogen may include preparing a mixture including the solvent in an amount of about 25% to about 66% by weight of the mixture, the acrylate monomer in an amount about of 20% to about 55% by weight of the mixture and the functional monomer in an amount of about 10% to about 30% by weight of the mixture.

The method may include forming a water-soluble pellicle adhesive by mixing the synthesized water-soluble acrylic adhesive material, water or a solution of water and alcohol (e.g., methyl alcohol), and an additive to prepare a mixture, and heating the mixture (S30). The water-soluble pellicle adhesive may include the water-soluble acrylic adhesive material in an amount of about 40% to about 55% by weight of the adhesive, the water or the solution of water and alcohol in an amount of about 40% to about 55% by weight of the adhesive, and the additive in an amount of about 1% to about 5% by weight of the adhesive. The alcohol may include methanol, ethanol, butanol or isopropanol. The additive may include a stabilizer and/or a dispersant.

Example compositions that may be used to manufacture a water-soluble acrylic adhesive material according to the inventive concept are provided in Table 1.

TABLE 1

| | step | | | | |
|---|---|---|---|---|---|
| | Copolymerization (unit: wt %) | | | | Substitution of functional group (unit: wt %) |
| Agent/No. | Arcrylate monomer | Acrylic acid or Acrylamide monomer | Radical initiator | Solvent | Metal salt or ammonium salt |
| Example 1 | Ethyl acrylate(35) | Acrylic acid(15) | Azobis isobutyro nitrile(3) | Ethanol(42) | Potassium hydroxide(5) |
| Example 2 | Ethyl acrylate(30) | Methacrylic acid(15) | Benzoyl peroxide(3) | Water/Methanol(48) | Sodium hydroxide(5) |
| Example 3 | Ethyl acrylate(40) | Acrylamide(10) | Di-tert-butyl peroxide(2) | Ethanol(43) | Calcium hydroxide(5) |
| Example 4 | Ethyl acrylate(25) | Methacrylamide(15) | Tert-butyl peroxy benzoate(2) | Ethyl acetate(53) | Sodium hydroxide(5) |
| Example 5 | Ethyl acrylate(35) | Maleimide(15) | Azobis isobutyro nitrile(3) | Water/Ethanol(42) | Sodium hydroxide(5) |
| Example 6 | 2-Ethylhexyl acrylate(35) | Acrylic acid(15) | Tert-butyl peroxy benzoate(3) | Hexane(42) | Ammonium hydroxide(5) |
| Example 7 | 2-Ethylhexyl acrylate(30) | Methacrylic acid(15) | Di-tert-butyl peroxide(3) | Water/Ethanol(48) | Ammonium hydroxide(5) |
| Example 8 | 2-Ethylhexyl acrylate(40) | Acrylamide(10) | Benzoyl peroxide(2) | Tetrahydrofuran(43) | Sodium hydroxide(5) |
| Example 9 | 2-Ethylhexyl acrylate(25) | Methacrylamide(15) | Azobis isobutyro nitrile(2) | Diethyl ether(53) | Potassium hydroxide(5) |
| Example 10 | 2-Ethylhexyl acrylate(35) | Maleimide(15) | Benzoyl peroxide(3) | Water/Methanol(42) | Potassium hydroxide(5) |
| Example 11 | n-Butyl methacrylate(35) | Acrylic acid(15) | Di-tert-butyl peroxide(3) | Hexane(42) | Sodium hydroxide(5) |
| Example 12 | n-Butyl methacrylate(30) | Methacrylic acid(15) | Azobis isobutyro nitrile(3) | Methyl acetate(48) | Ammonium hydroxide(5) |
| Example 13 | n-Butyl methacrylate(40) | Methacrylamide(10) | Tert-butyl peroxy benzoate(2) | Water/Methanol(43) | Sodium hydroxide(5) |
| Example 14 | n-Butyl methacrylate(25) | Acrylamide(15) | Benzoyl peroxide(2) | Ethanol(53) | Potassium hydroxide(5) |
| Example 15 | n-Butyl methacrylate(35) | Maleimide(15) | Di-tert-butyl peroxide(3) | Tetrahydrofuran(42) | Potassium hydroxide(5) |
| Example 16 | Glycidyl methacrylate(35) | Acrylic acid(15) | Azobis isobutyro nitrile(3) | Tetrahydrofuran(42) | Sodium hydroxide(5) |
| Example 17 | Glycidyl methacrylate(30) | Methacrylic acid(15) | Benzoyl peroxide(3) | Hexane(48) | Calcium hydroxide(5) |
| Example 18 | Glycidyl methacrylate(40) | Methacrylamide(10) | Azobis isobutyro nitrile(2) | Hexane(43) | Calcium hydroxide(5) |

TABLE 1-continued

| | | Copolymerization (unit: wt %) | | | Substitution of functional group (unit: wt %) |
|---|---|---|---|---|---|
| Agent/No. | Arcrylate monomer | Acrylic acid or Acrylamide monomer | Radical initiator | Solvent | Metal salt or ammonium salt |
| Example 19 | Glycidyl methacrylate(25) | Acrylamide(15) | Tert-butyl peroxy benzoate(2) | Tetrahydrofuran(53) | Sodium hydroxide(5) |
| Example 20 | Glycidyl methacrylate(35) | Maleimide(15) | Benzoyl peroxide(3) | Tetrahydrofuran(42) | Sodium hydroxide(5) |

The polymerization may be performed at a temperature about 100° C., and the substitution of the acidic hydrogen in a functional group may be performed at a temperature about 70° C. The following chemical formulas are Chemical Formula 1 of ethyl acrylate monomer, Chemical Formula 2 of an acrylic acid monomer, and Chemical Formula 3 of an acrylamide monomer.

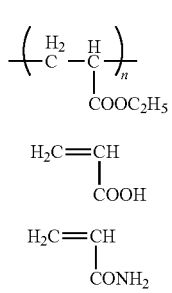

Chemical Formula 1

Chemical Formula 2

Chemical Formula 3

The following chemical formulas are acrylic acid substituted with potassium (Chemical Formula 4), acrylic acid substituted with sodium (Chemical Formula 5) and acrylic acid substituted with amine (Chemical Formula 6).

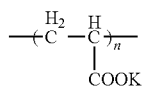

Chemical Formula 4

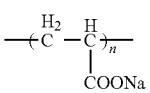

Chemical Formula 5

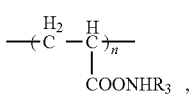

Chemical Formula 6 wherein R is hydrogen or a $C_1$ to $C_3$ alkyl group.

In some embodiments, a pellicle adhesive may be prepared by mixing a water-soluble acrylic adhesive material in an amount of about 50% by weight of the pellicle adhesive, an ethanol solution in an amount of about 45% by weight of the pellicle adhesive, and an additive in an amount of about 5% by weight of the pellicle adhesive. The water-soluble acrylic adhesive material may be formed using reactants provided in Table 1.

Figure 3:
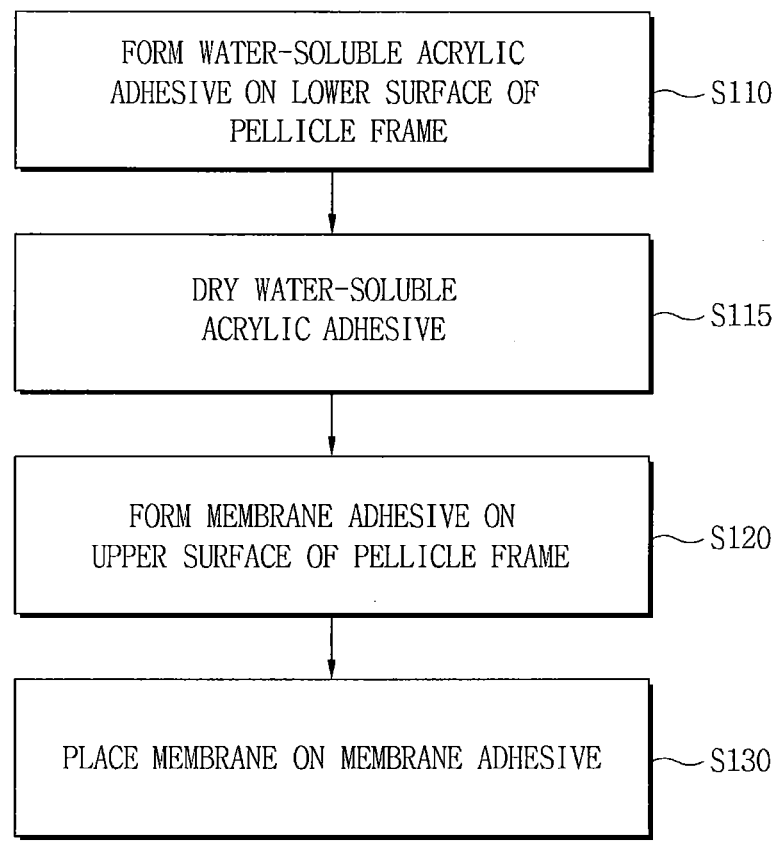
FIG. 3 is a flowchart of a method of manufacturing a pellicle according to some embodiments of the inventive concept.

FIG. 3 is a flowchart of a method of manufacturing the pellicle 220 according to some embodiments of the inventive concept. Referring to FIG. 3, the method of manufacturing the pellicle 220 according to the inventive concept may include forming (e.g., applying) the water-soluble acrylic adhesive on a lower surface of the pellicle frame 223 (S110). The water-soluble acrylic adhesive may be directly coated on the lower surface of the pellicle frame 223, or the water-soluble acrylic adhesive formed in a tape or film form may be attached to the lower surface of the pellicle frame 223. In some embodiments, the water-soluble acrylic adhesive in the tape or film form may have a liner 225 on one surface thereof as illustrated in FIGS. 1A and 1B. In some embodiments, the method may include drying the water-soluble acrylic adhesive (S115). The method may include forming (e.g., applying) a membrane adhesive 222 on an upper surface of the pellicle frame 223 (S120) and placing a membrane 221 on the membrane adhesive 222 (S130).

Figure 4:
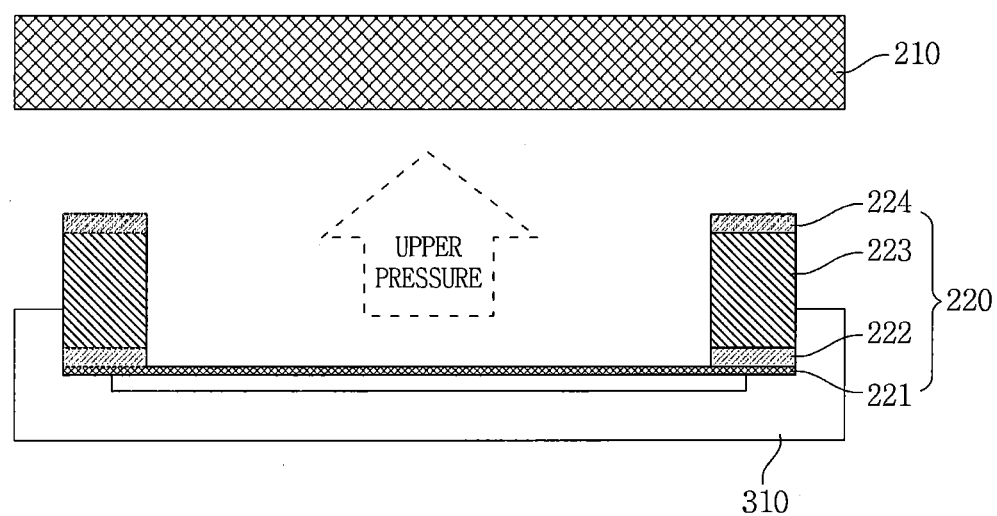
FIG. 4 is a cross-sectional view illustrating attaching a pellicle to a photomask according to some embodiments of the inventive concept.

FIG. 4 is a cross-sectional view illustrating attaching a pellicle 220 to a photomask 210 according to some embodiments of the inventive concept. Referring to FIG. 4, the pellicle 220 may be fixed on a pellicle mounter 310, the pellicle mounter 310 may be elevated, and the pellicle 220 may be attached to a surface of the photomask 210. The pellicle 220 may be fixed on the pellicle mounter 310 so that the membrane 221 faces downward. The membrane 221 may be spaced apart from the pellicle mounter 310, and the pellicle frame 223 may be in contact with the pellicle mounter 310. Further referring to FIGS. 1A and 1B, after the pellicle 220 is fixed on the pellicle mounter 310 and before the pellicle mounter 310 is elevated, the liner 225 may be removed.

Figure 5A:
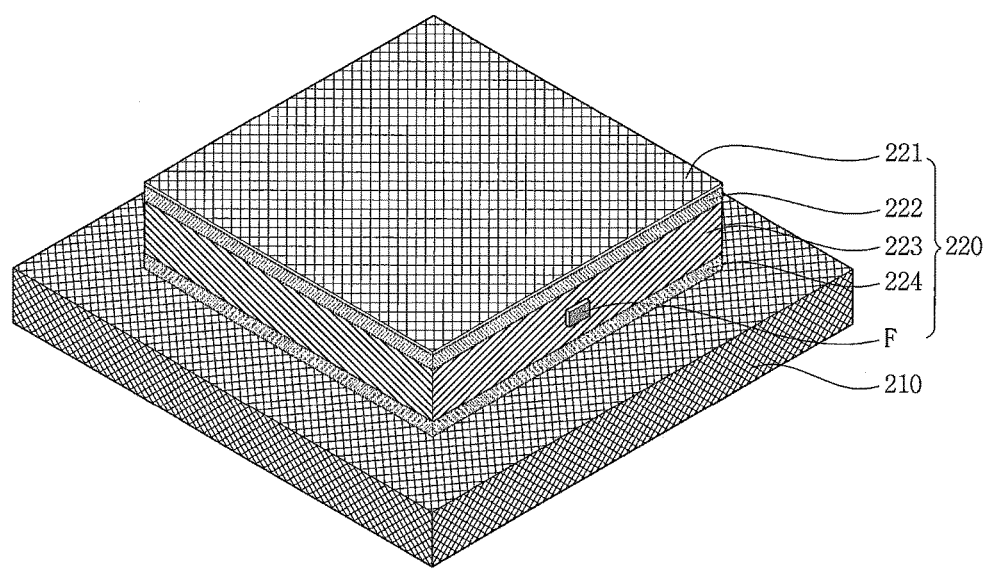
FIGS. 5A and 5B are a perspective view and a cross-sectional view of a photomask assembly according to some embodiments of the inventive concept, respectively.
Figure 5B:
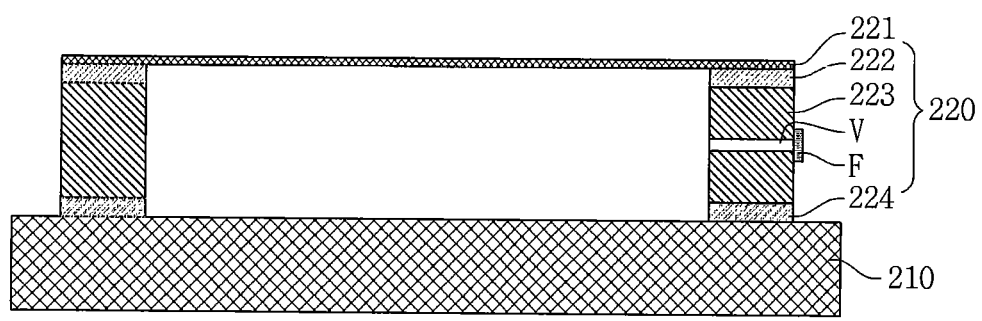

FIGS. 5A and 5B are a perspective view and a cross-sectional view of a photomask assembly 200 according to some embodiments of the inventive concept, respectively. Referring to FIGS. 5A and 5B, the photomask assembly 200 according to the inventive concept may include a photomask 210 and a pellicle 220 mounted on a surface of the photomask 210. The pellicle 220 may be attached to the patterned surface of the photomask 210. Therefore, patterns of the photomask 210 may be protected by the pellicle 220. The vent hole V may provide an air path connecting the inside of the pellicle 220 with the outside. Therefore, the pellicle 220 may be possibly prevented from expansion and contraction by difference in air pressure. Further, the inside temperature of the pellicle 220 may also be cooled down. The filter F may filter particles included in the air introduced and exhausted through the vent hole V so that the inside of the pellicle 220 or the patterned surface of the photomask 210 may not be contaminated.

Figure 6:
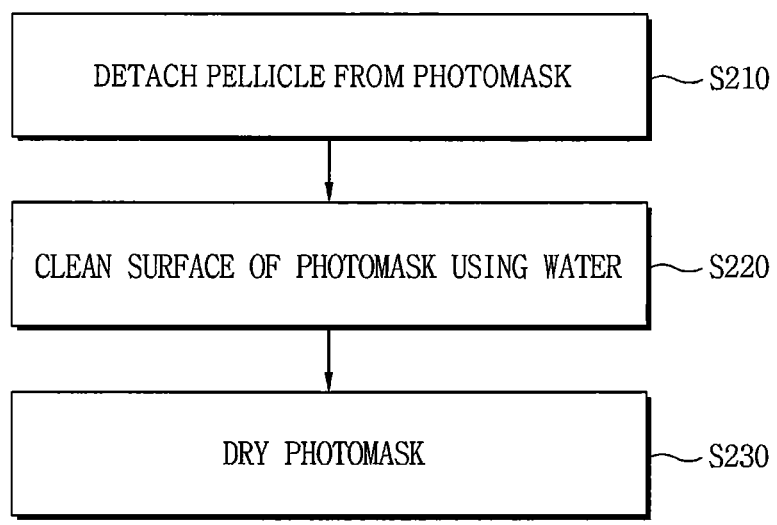
FIG. 6 is a flowchart of a method of detaching a pellicle from a photomask and cleaning the photomask according to some embodiments of the inventive concept.
Figure 7:
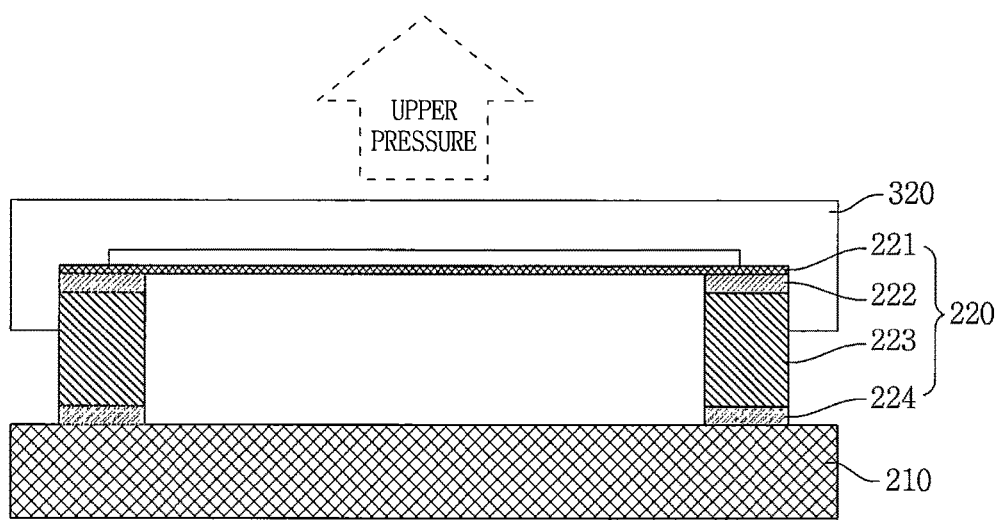
FIG. 7 is a cross-sectional view illustrating detaching a pellicle from a photomask according to some embodiments of the inventive concept.

FIG. 6 is a flowchart of a method of detaching the pellicle 220 from the photomask 210 and cleaning the photomask 210 according to some embodiments of the inventive concept. FIG. 7 is a cross-sectional view illustrating detaching the pellicle 220 from the photomask 210 according to some embodiments of the inventive concept. FIGS. 8A to 8D illustrate methods of cleaning the surface of the photomask 210 after detaching the pellicle 220 according to some embodiments of the inventive concept.

Referring to FIGS. 6 and 7, a method of detaching a pellicle 220 and cleaning the photomask 210 according to some embodiments of the inventive concept may include detaching the pellicle 220 from the photomask 210 using a pellicle demounter 320 (S210). For example, the pellicle demounter 320 may hold the pellicle frame 223 of the pellicle 220 attached to the photomask 210 and may be elevated so that the pellicle 220 is separated from the photomask 210

Figure 8A:
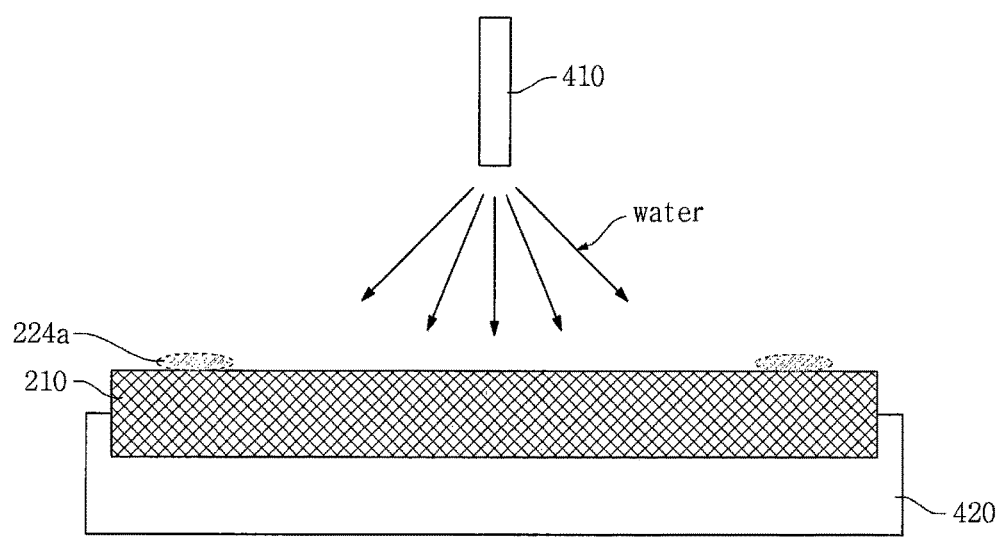
FIGS. 8A to 8D illustrate methods of cleaning a photomask surface after detaching a pellicle according to some embodiments of the inventive concept.
Figure 8B:
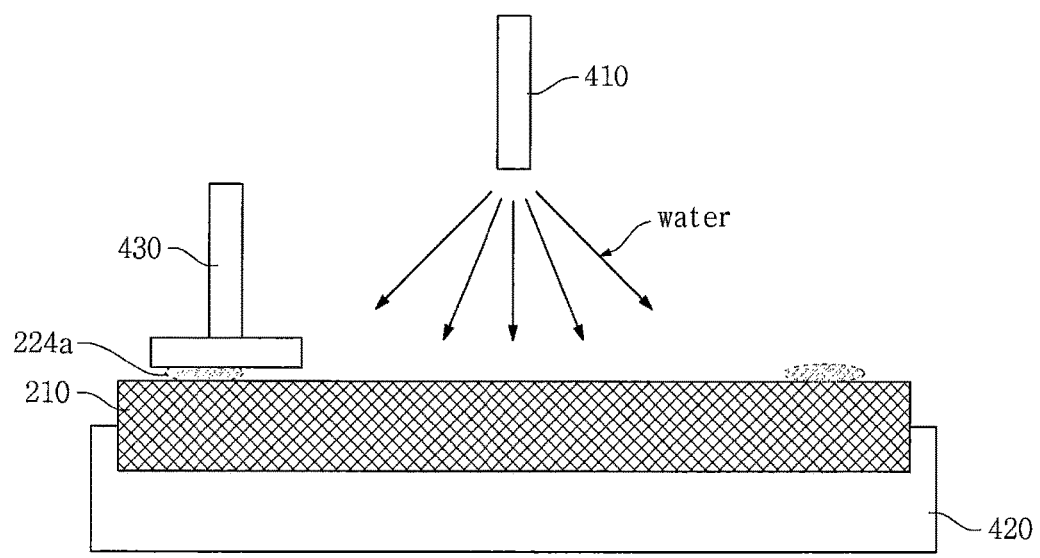
Figure 8C:
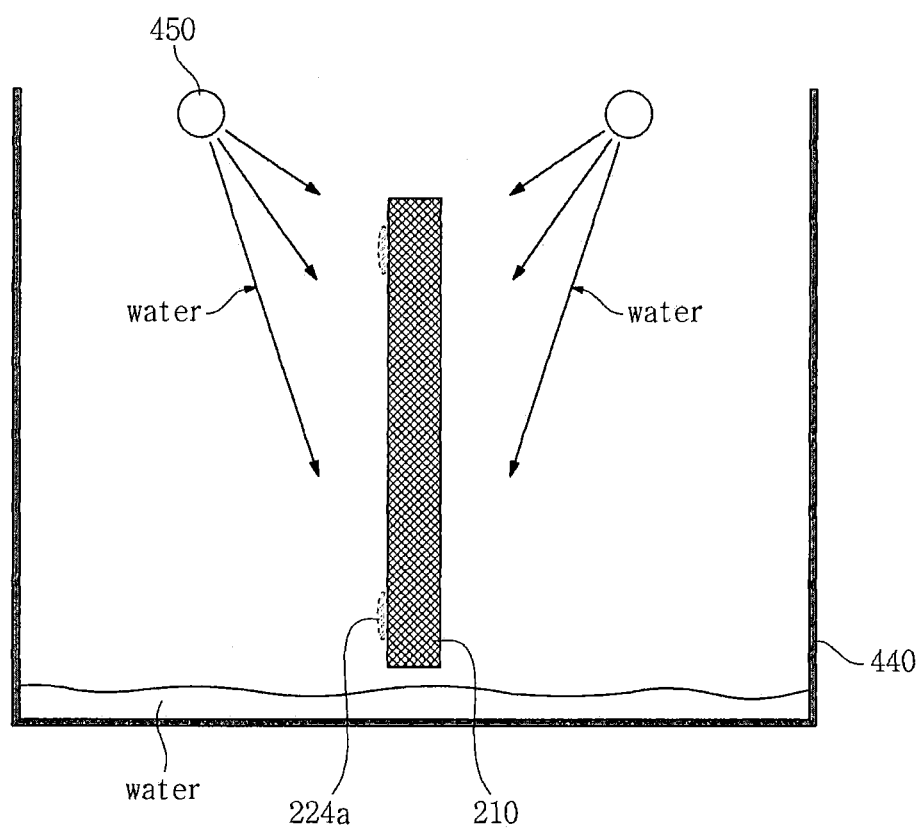
Figure 8D:
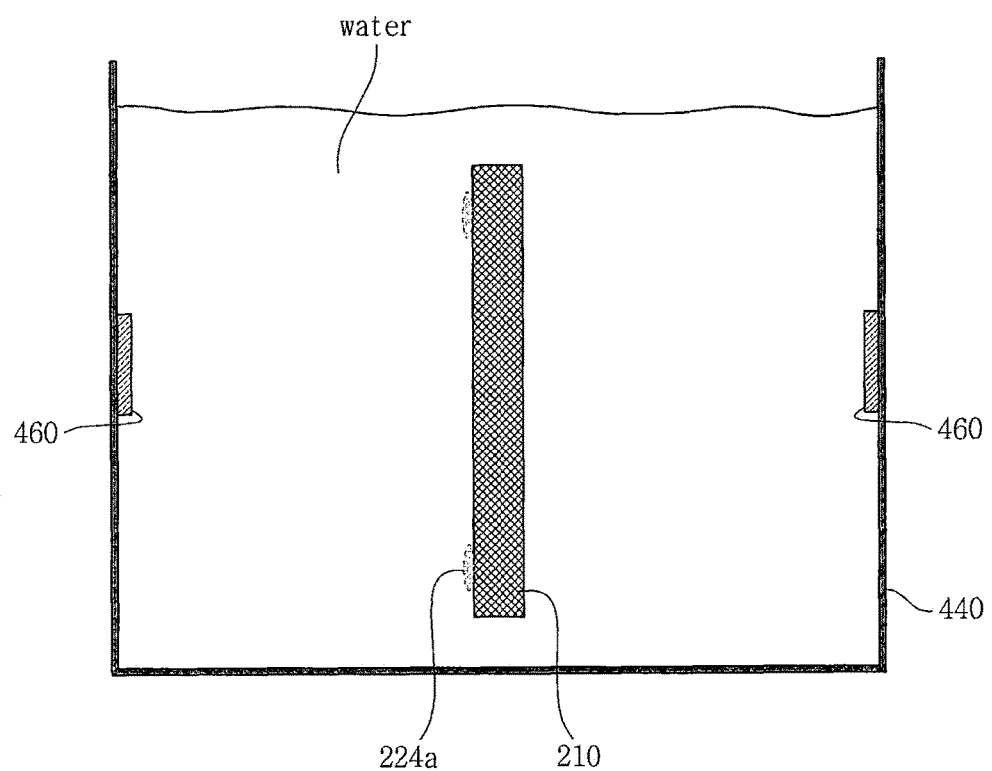

Referring to FIGS. 6 and 8A to 8D, the method may include cleaning a pellicle adhesive residue 224a remaining on a surface of the photomask 210 from which the pellicle 220 is separated using water (S220). Referring to FIG. 8A, the method may include spraying water onto the surface of the photomask 210 using a spray nozzle 410. The photomask 210 may be loaded on a chuck 420 and rotated. Referring to FIG. 8B, the method may further include scrubbing the surface of the photomask 210 using a scrubber 430. Referring to FIG. 8C, the method may include placing the photomask 210 into a water tank 440 and spraying water onto the photomask 210 using a shower nozzle 450. In some embodiments, referring to FIG. 8D, the photomask 210 may be dipped into the water in the water tank 440. The method may include cleaning the pellicle adhesive residue 224a on the surface of the photomask 210 using a mega-sonic or an ultrasonic provided by a vibrator 460 in the water tank 440. Referring to FIG. 8A to 8D, the pellicle adhesive residue 224a on the surface of the photomask 210 may be removed using water.

According to some embodiments of the inventive concept, the pellicle adhesive residue 224a on the surface of the photomask 210 may be cleaned by using only water. For example, the surface of the photomask 210 may be cleaned by using only water and without using a reactive solvent such as sulfuric acid ($H_2SO_4$) or hydrogen peroxide ($H_2O_2$).

The method may include performing a drying process so that the photomask 210 is dried (S230). The drying process may include at least one of a natural drying process, a heating and drying process, and a drying process using isopropyl alcohol (IPA).

Then, the method may include inspecting the photomask 210 to verify whether there is the pellicle adhesive residue 224a on a surface of the photomask 210 and continuing with subsequent processes. The subsequent processes may include re-cleaning the photomask 210 or attaching a new pellicle 220 onto the photomask 210.

Figure 9:
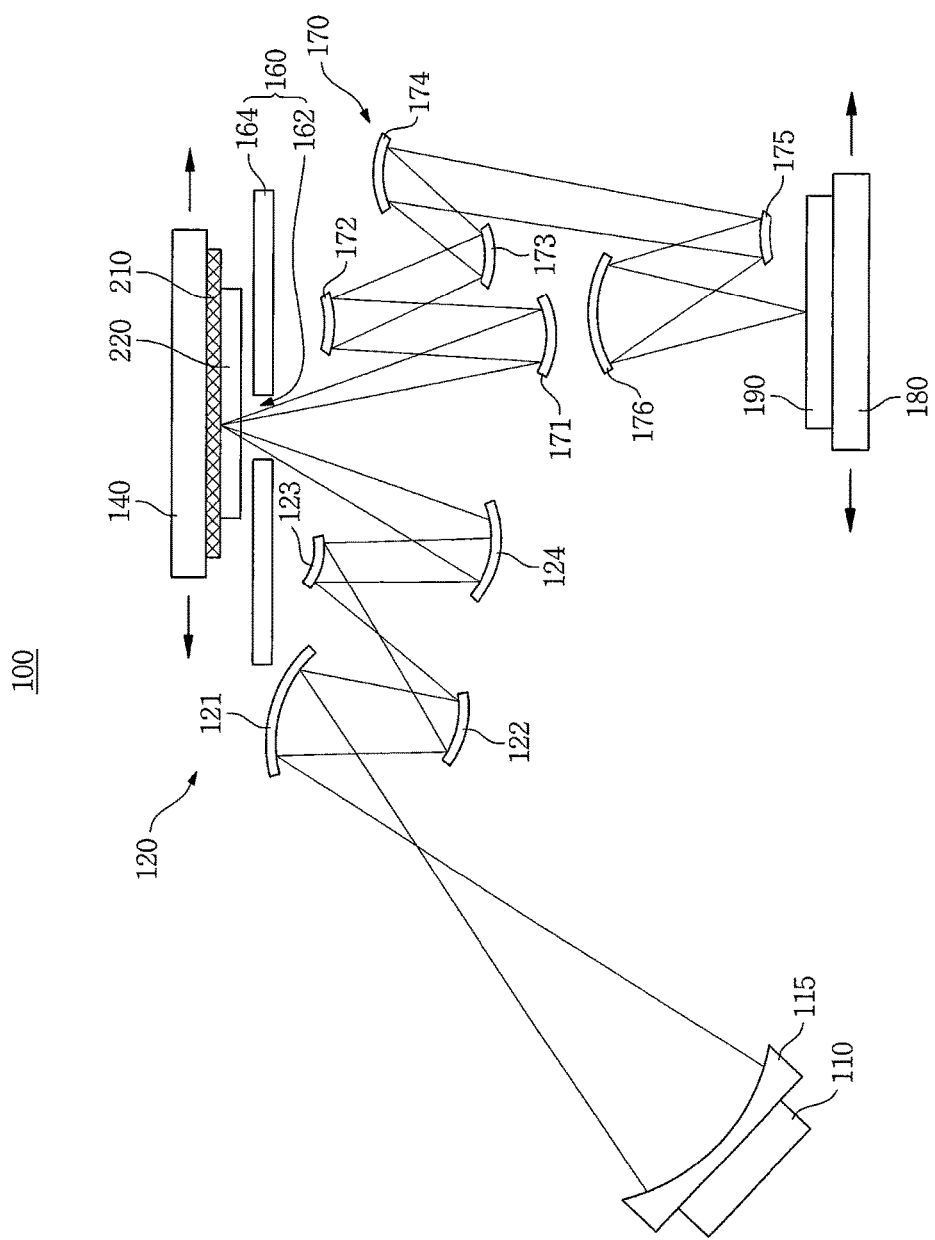
FIG. 9 illustrates a reflective photolithography process using a photomask to which a pellicle is attached according to some embodiments of the inventive concept.

FIG. 9 illustrates a reflective photolithography process using a photomask 210 to which a pellicle 220 is attached according to some embodiments of the inventive concept.

Referring to FIG. 9, a method of performing a reflective photolithography process using a photomask 210 to which a pellicle 220 is attached according to some embodiments of the inventive concept may include mounting the photomask 210 onto a photomask stage 140 of a reflective photolithography system 100 including a light source 110, an illumination mirror system 120, the photomask stage 140, a blinder 160, a projection mirror system 170 and a wafer stage 180 so that the photomask 210 may face downward.

The light source 110 may generate, for example, extreme ultraviolet light (EUVL). For example, the light source 110 may generate light having a wavelength of about 13.5 nm such as the EUVL using carbon plasma. The light source 110 may include a light collector 115. The light collector 115 may collect the EUVL generated from the light source 110 to adjust the EUVL so as to travel straight in a direction. For example, the EUVL generated from the light source 110 may pass through the light collector 115 and be applied to the illumination mirror system 120.

The illumination mirror system 120 may include a plurality of illumination mirrors 121 to 124. For example, the illumination mirrors 121 to 124 may condense the EUVL to reduce the reflected EUVL veering out of the mirrored emitting path and being lost. Further, the illumination mirrors 121 to 124, for example, may control the intensity distribution of the EUVL uniformly overall. Therefore, the illumination mirrors 121 to 124 may each have a concave mirror and/or a convex mirror to make various paths of the EUVL. Further, the illumination mirror system 120 may form a shape of the EUVL into a square shape, a circular shape, or a bar shape and deliver the formed EUVL to the photomask stage 140.

The photomask stage 140 may mount the photomask 210 on the lower surface thereof and move in a horizontal direction. For example, the photomask stage 140 may move in the arrow directions in FIG. 9. The photomask stage 140 may have an electrostatic chuck (ESC). The photomask 210 may include optical patterns on one surface thereof. The photomask 210 may be mounted on the lower surface of the photomask stage 140 so that the surface thereof on which optical patterns are formed faces downward.

The blinder 160 may be disposed under the photomask stage 140. The blinder 160 may have a slit 162 and a plate 164. The slit 162 may have an aperture shape. The slit 162 may form the shape of the EUVL delivered from the illumination mirror system 120 to the photomask 210 on the photomask stage 140. The EUVL delivered form the illumination mirror system 120 may pass through the slit 162 and be applied to the photomask 210 on the photomask stage 140. The EUVL reflected from the photomask 210 on the photomask stage 14Q may pass through the slit 162 and be delivered to the projection mirror system 170. The plate 164 may block the EUVL which is incident into regions except the slit 162. Therefore, a portion of the EUVL may pass the blinder 160 through the slit 162, and a portion of the EUVL may be blocked by the plate 164. Further, the EUVL reflected form the photomask 210 of the photomask stage 140 may pass through the slit 162.

The projection mirror system 170 may receive the EUVL reflected from the photomask 210 and passed through the slit 162 and may transfer the EUVL to a wafer 190. The projection mirror system 170 may also have a plurality of projection mirrors 171 to 176. The EUVL incident on the wafer 190 by the projection mirrors 171 to 176 may have virtual aerial image information of optical patterns of the photomask 210. The shape of the EUVL incident on the wafer 190 may have a shape formed with the slit 162. The plurality of projection mirrors 171 to 176 may correct various aberrations.

The wafer stage 180 may accommodate the wafer 190 and move in a horizontal direction. For example, the wafer stage 180 may move in the arrow directions in FIG. 9. The wafer stage 180 may simultaneously move with the photomask stage 140 in the same direction in a set proportion. For example, in the case that movement proportion of the photomask stage 140 to the wafer stage 180 is 10 to 1, when the photomask stage 140 move 10 µm in a leftward or rightward direction, the wafer stage 180 may move 1 µm in the same direction as the photomask stage 140. Further, in the case that the movement proportion is 5 to 1, when the photomask stage 140 move 10 µm in a leftward or rightward direction, the wafer stage 180 may move 2 µm in the same direction as the photomask stage 140. The movement proportion may be variously set. For example, the wafer stage 180 may be moved with a step-and-scan scheme. The focal point of the EUVL applied from the projection mirror system 170 may be disposed above or on a surface of the wafer 190. For example, a photoresist layer having a uniform thickness may be formed on the wafer 190 and the focal point of the EUVL may be disposed inside the photoresist layer.

It will be understood that, the paths of the EUVL in FIG. 9 are conceptually illustrated for easily understanding the inventive concept.

Since a pellicle adhesive according to the inventive concept is water-soluble, the pellicle adhesive may be removed using only water and no acid may be used. Accordingly, the process of removing and cleaning pellicle adhesive residue may be simple and eco-friendly.

According to the inventive concept, since acid is not used to remove pellicle adhesive residue, haze defects on the photomask may not occur. Further since a treatment process of a haze defect may be omitted, productivity may thus increase.

According to the inventive concept, since the photomask may be cleaned using only water without acid, chemical attack on the photomask may be reduced and the lifetime of the photomask may be increased.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A method of manufacturing a pellicle adhesive, comprising:
    copolymerizing an acrylate monomer and a functional monomer, the functional monomer comprising a COOH group or a $CONH_2$ group; and
    substituting a hydrogen ion of the COOH group or the $CONH_2$ group with a sodium ion, a potassium ion, a calcium ion, or an ammonium ion ($NHR_3^+$) to form a water-soluble acrylic adhesive material, wherein R is hydrogen or a $C_1$ to $C_3$ alkyl group,
    wherein the copolymerizing and the substituting steps comprise mixing a solvent in an amount of about 25% to about 66% by weight of the water-soluble acrylic adhesive material, the acrylate monomer in an amount of about 20% to about 55% by weight of the water-soluble acrylic adhesive material, and the functional monomer in an amount of about 10% to about 30% by weight of the water-soluble acrylic adhesive material.

2. The method of claim 1, wherein the copolymerizing is initiated by a radical initiator, and
    wherein the radical initiator comprises at least one of azobis iso-butyro nitrile, benzoyl peroxide, di-tert-butyl peroxide, and tert-butyl peroxybenzoate.

3. The method of claim 1, wherein the substituting is performed using at least one salt of KOH, NaOH, $Ca(OH)_2$, and $NH_4OH$.

4. The method of claim 1, wherein the acrylate monomer comprises at least one of methyl acrylate, ethyl acrylate, isopropyl acrylate, n-butyl acrylate, 2-ethylhexyl acrylate, n-butyl methacrylate, and glycidyl methacrylate.

5. The method of claim 1, wherein the functional monomer comprises an acrylic acid monomer or an amide monomer.

6. The method of claim 5, wherein the acrylic acid monomer comprises at least one of acrylic acid and methacrylic acid.

7. The method of claim 5, wherein the amide monomer comprises at least one of acrylamide, methacrylamide, and maleimide.

8. The method of claim 1, wherein the copolymerizing is performed at a temperature in a range of about 30° C. to about 150° C., and the substituting is performed at a temperature in a range of about 0° C. to about 100° C.

9. The method of claim 1, further comprising:
    preparing a mixture including the water-soluble acrylic adhesive material in an amount of about 40% to about 55% by weight of the pellicle adhesive, water or a solution of water and alcohol in an amount of about 40% to about 55% by weight of the pellicle adhesive, and an additive in an amount of about 1% to about 5% by weight of the pellicle adhesive; and
    heating the mixture.

10. The method of claim 9, wherein the alcohol comprises at least one of methanol, ethanol, butanol, and isopropanol.

11. The method of claim 9, wherein the additive comprises a stabilizer and/or a dispersant.

12. A method of manufacturing a pellicle adhesive, the method comprising:
    copolymerizing an acrylate monomer and a functional monomer, the functional monomer comprising a COOH group or a $CONH_2$ group;
    substituting a hydrogen ion of the COOH group or the $CONH_2$ group with a sodium ion, a potassium ion, a calcium ion, or an ammonium ion ($NHR_3^+$) to form a water-soluble acrylic adhesive material, wherein R is hydrogen or a $C_1$ to $C_3$ alkyl group;
    preparing a mixture including the water-soluble acrylic adhesive material, water or a solution of water and alcohol, and an additive; and
    heating the mixture,
    wherein the mixture includes the water-soluble acrylic adhesive material in an amount of about 40% to about 55% by weight of the pellicle adhesive, water or the solution of water and alcohol in an amount of about 40% to about 55% by weight of the pellicle adhesive, and the additive in an amount of about 1% to about 5% by weight of the pellicle adhesive.

13. The method of claim 12, wherein the alcohol comprises at least one of methanol, ethanol, butanol, and isopropanol.

14. The method of claim 12, wherein the additive comprises a stabilizer and/or a dispersant.

15. A method of manufacturing a pellicle adhesive, the method comprising:
    preparing a mixture including a solvent, an acrylate monomer, a functional monomer, and a salt of at least one of KOH, NaOH, $Ca(OH)_2$, and $NH_4OH$, wherein the functional monomer comprises a COOH group or a $CONH_2$ group; and copolymerizing the acrylate monomer and the functional monomer and substituting a hydrogen ion of the COOH group or the $CONH_2$ group with a sodium ion, a potassium ion, a calcium ion, or an ammonium ion ($NHR_3^+$) in the mixture to form a water-soluble acrylic adhesive material, wherein R is hydrogen or a $C_1$ to $C_3$ alkyl group, wherein the mixture includes the solvent in an amount of about 25% to about 75% by weight of the mixture, the acrylate monomer in an amount of about 20% to about 55% by weight of the mixture, the functional monomer in an amount of about 5% to about 20% by weight of the mixture, and the salt in an amount of about 3% to about 5% by weight of the mixture.

16. The method of claim 15, wherein the mixture further includes a radical initiator that initiates copolymerization of the acrylate monomer and the functional monomer.

17. The method of claim 16, wherein the radical initiator comprises at least one of azobis iso-butyro nitrile, benzoyl peroxide, di-tert-butyl peroxide, and tert-butyl peroxybenzoate.

18. The method of claim 15, wherein the copolymerizing is performed at a temperature in a range of about 30° C. to about 150° C., and the substituting is performed at a temperature in a range of about 0° C. to about 100° C.

* * * * *